United States Patent [19]
Yamazaki

[11] Patent Number: 5,538,911
[45] Date of Patent: Jul. 23, 1996

[54] MANUFACTURING METHOD FOR A DIAMOND ELECTRIC DEVICE

[75] Inventor: Shunpei Yamazaki, Tokyo, Japan

[73] Assignee: Semiconductor Energy Laboratory Co., Ltd., Kanagawa-ken, Japan

[21] Appl. No.: 748,422

[22] Filed: Aug. 22, 1991

Related U.S. Application Data

[62] Division of Ser. No. 537,991, Jun. 13, 1990, Pat. No. 5,075,764.

[30] Foreign Application Priority Data

Jun. 22, 1989 [JP] Japan .................................. 1-159867
Jun. 26, 1989 [JP] Japan .................................. 1-162997

[51] Int. Cl.⁶ .................................................. H01L 21/265
[52] U.S. Cl. ........................ 437/41; 437/126; 437/913; 437/127
[58] Field of Search ........................... 437/41, 913, 126, 437/127

[56] References Cited

U.S. PATENT DOCUMENTS

| | | | |
|---|---|---|---|
| 3,873,373 | 3/1975 | Hill | 437/913 |
| 4,764,804 | 8/1988 | Sahara et al. | 437/209 |
| 4,889,783 | 12/1989 | Yamazaki | 430/57 |

FOREIGN PATENT DOCUMENTS

| | | |
|---|---|---|
| 213126 | 12/1984 | Japan. |
| 246627 | 12/1985 | Japan. |
| 263141 | 11/1986 | Japan. |

OTHER PUBLICATIONS

S. Wolf + R. N. Tauber, *Silicon Processing for the VLSI Era vol. 1: Process Technology*, Lattice Press; Sunset Beach, CA, (1986) pp. 321–323.

Iwaki, M., et al. "Electrical conductivity of nitrogen and argon implanted diamond" Nuclear Instrum. & Methods Phy. Res. vol. 209–210, pt. 2, pp. 1129–1133, 1–15, May 1983.

*Primary Examiner*—R. Bruce Breneman
*Assistant Examiner*—Linda J. Fleck
*Attorney, Agent, or Firm*—Sixbey, Friedman, Leedom & Ferguson; Gerald J. Ferguson, Jr.

[57] ABSTRACT

An electric device such as a light emitting device utilizing a diamond film is described. The diamond film is partially doped with an impurity selected from Group IIb or VIb of the periodic table. The doping is performed with a patterned semiconductor film as a mask in a self-aligning manner. An electrode arrangement is formed on the semiconductor film or the doped diamond film so that stability of contacts can be obtained.

7 Claims, 5 Drawing Sheets

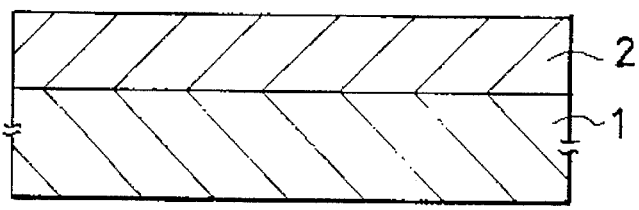
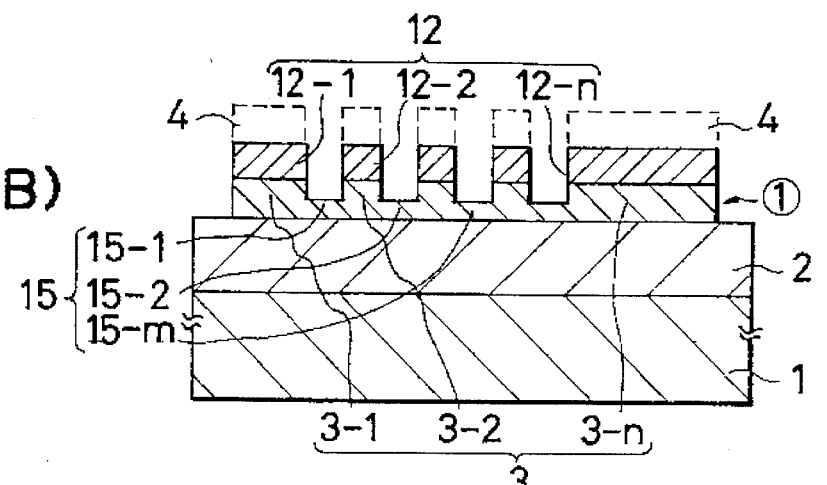
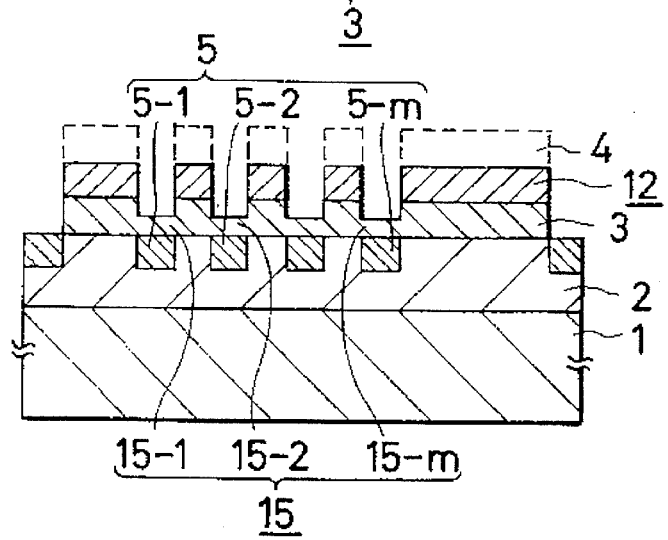
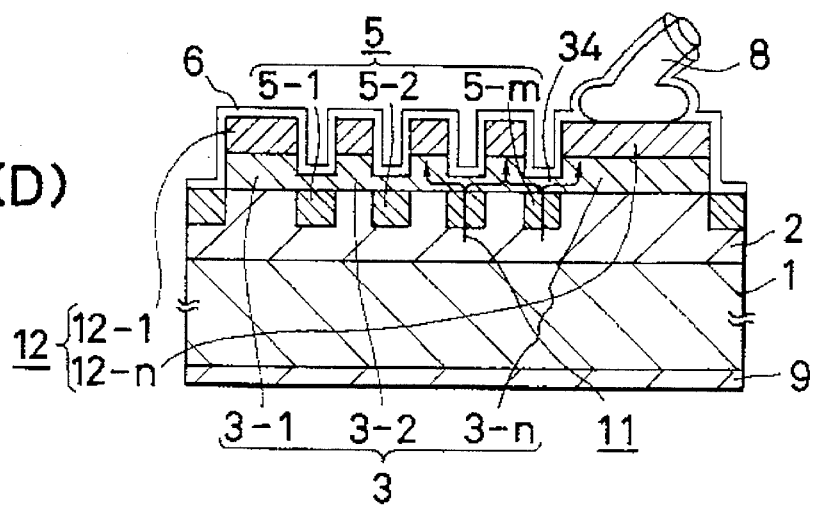
FIG. 3(A)
FIG. 3(B)
FIG. 3(C)
FIG. 3(D)

MANUFACTURING METHOD FOR A DIAMOND ELECTRIC DEVICE

This is a Divisional application of Ser. No. 07/537,991, filed Jun. 13, 1990, now U.S. Pat. No. 5,075,764.

BACKGROUND OF THE INVENTION

1. Field of the Invention

The present invention relates to diamond electric devices, more particularly to diamond semiconductor electric devices such as light emitting devices, and manufacturing methods for the same.

2. Description of the Prior Art

For emission of reddish light rays, GaAs semiconductors have been utilized to manufacture light emitting devices for more than a decade. The emission of blue or green light, as well as white light, however, has long been hardly realized by means of solid state devices.

The inventor has before proposed to make a light emitting device from diamond which can emit light at short wave lengths, for example, as described in Japanese Patent Application No sho 56-146, 930 filed on Sep. 17, 1981. Diamond is promising, as a light emitting substance for mass production, because of its high thermal resistance, chemically stabilities and low price, in view of a great demand for light emitting devices in the market. It is, however, very difficult to manufacture diamond light emitting devices at a high yield required for commercialization because there are formed a large proportion of products whose efficiencies are undesirably too low to satisfy the requirement of the application thereof.

SUMMARY OF THE INVENTION

It is an object of the present invention to provide an electric device with a diamond film having a high performance.

It is another object of the present invention to provide a diamond electric device having a long life time.

Additional objects, advantages and novel features of the present invention wil be set forth in the description which follows, and in part will become apparent to those skilled in the art upon examination of the following or may be learned by practice of the present invention. The object and advantages of the invention may be realized and attained by means of the instrumentalities and combinations particularly pointed out in the appended claims.

The present invention has been culminated based upon the discovery of the origin of the low yield of diamond light emitting device manufacture. The light emitting action of diamond light emitting devices takes place when a relatively large current is passed through diamond crystals by applying a voltage between a pair of electrodes sandwiching the diamond crystals. The electric energy carried by the current, however, is consumed largely only to produce heat rather than to emit light rays. The inventor successed in the discovery of the origin of the low efficiencies and the heat generation. As a result, it has been found that schottokey contacts between diamond films and metal electrodes can not be formed with stable characteristics and desired performance. Diamond films hardly makes good electric contact with metal surfaces. Futhermore, it is very difficult to deposit a diamond film having an n-type conductivity while the formation of p-type diamond films is relatively easy.

In order to accomplish the foregoing and other objects and advantages, it is proposed to add an impurity to a diamond film with which a metallic electrode makes contact. The doping of impurity makes it possible to form satisfactory contact between diamond and a metal and increases the conductivity of the diamond film so that current tends to flow preferentially through the impurity diamond. In a preferred embodiment, the doping to the diamond film is only partially effected. If an electrode is formed on the undoped portion, a usual semiconductor film such as a silicon semiconductor film, which are relatively easy to make suitable contact with the electrode, is interposed between the electrode and the diamond film. The direct contact between undoped diamond and a metal is avoided in this structure.

By this structure, metallic electrodes make electrical contact only with impurity diamond or usual semiconductor films and therefore metal-semiconductor contacts can be easily formed without dispersed characteristics. One of the important applications is the diamond light emitting deivce. The current passing through the diamond film induces recombination of electron-hole pairs between mid-gap states (radiation centers), between the mid-gap states and a valence band, between a conduction band and the mid-gap states and between the conduction band and the valence band. The spectrum of light emitted from a diamond film is determined by differential energy levels between the mid-gap states, the bottom of the conduction band and the apex of the valence band. Depending upon the differential levels, it is possible to emit blue or green light or radiation having continuous spectrum of wavelengths over a relatively wide range such as white light. For example, when a dopant of an element of Group IIa such as zinc or cadomium or an element of Group VIb such as oxygen, sulfer, selenium or tellurium is introduced, e.g. by ion implantation, effective radiation of blue light can be observed. The associated intervening semiconductor films are doped with an element of Group IIIb such as boron, aluminum, gallium or indium, or an element of Group Vb such as nitrogn, arsenic or antimony in order to form p-type or n-type semiconductors to make good contact with a matallic electrode. These elements may be introduced also into the diamond film. The spectra of radiation, however, tends to shift from a blue region to a green region in that case.

Ion implantation is suitable for use in formation of such diamond light emitting devices. The introduction of impurity can be accomplished in a uniform manner irrespective of diverse geometries of diamond particles and morphology of crystalline structure. The ion bombardment produces many defects in the diamond films. The defects can function as recombination centers from which light emission occurs. If the addition of impurity is carried out only by diffusion, the impurity is concentrated at grain boundaries and the activity of the diamond film is substantially reduced. Preferably, after the ion implantation, the diamond film is subjected to thermal annealing in air or an oxidizing atmosphere such as oxygen or NOx atmosphere at 200° to 1000° C., e.g. 800° C. By this treatment, only atomic level distortion is alleviated leaving defects, and therefore the number of recombination center is not reduced. What is more advantageous fact is that the ion implantation into the diamond film decreases the resistivity of the impurity diamond film so that current tends to flow selectively through the implanted diamond.

The structure of light emitting devices and impurities suitable to form diamond films capable of emitting blue light are described infra in accordance with a preferred embodiment of the present invention.

A diamond film containing an element of Group IIb of the periodic table is deposited on an insulating substrate, for example, by plasma vapor reaction of a reactive gas comprising $(CH_3)_2Zn$ and $CH_3OH$ diluted with hydrogen. An n-type semiconductor film is deposited as a buffer film on the diamond film. The semicoductor film is partially removed, and an element of Group VIb or IIb (VIb preferred) such as S or Se is selectively added to the exposed diamond film. On the semiconductor film or the exposed diamond film, a pair of electrodes are formed through a buffer film if necessary.

BRIEF DESCRIPTION OF THE DRAWINGS

The accompanying drawings, which are incorporated in and form a part of the invention and, together with the description, serve to explain the principles of the invention.

FIGS. 3(A) to 3(D) are cross sectional views showing a method of manufacturing diamond light emitting devices in accordance with a second embodiment of the present invention.

DETAILED DESCRIPTION OF THE PREFERRED EMBODIMENTS

The formation of diamond films by means of chemical vapor reaction has been proposed by the applicant in Japanese Patent Application No. sho 61-292859 filed on Dec. 9th, 1986 and U.S. patent application No. 07/178,362. Hereinbelow, the process of the formation of diamond will be briefed.

Figure 1:
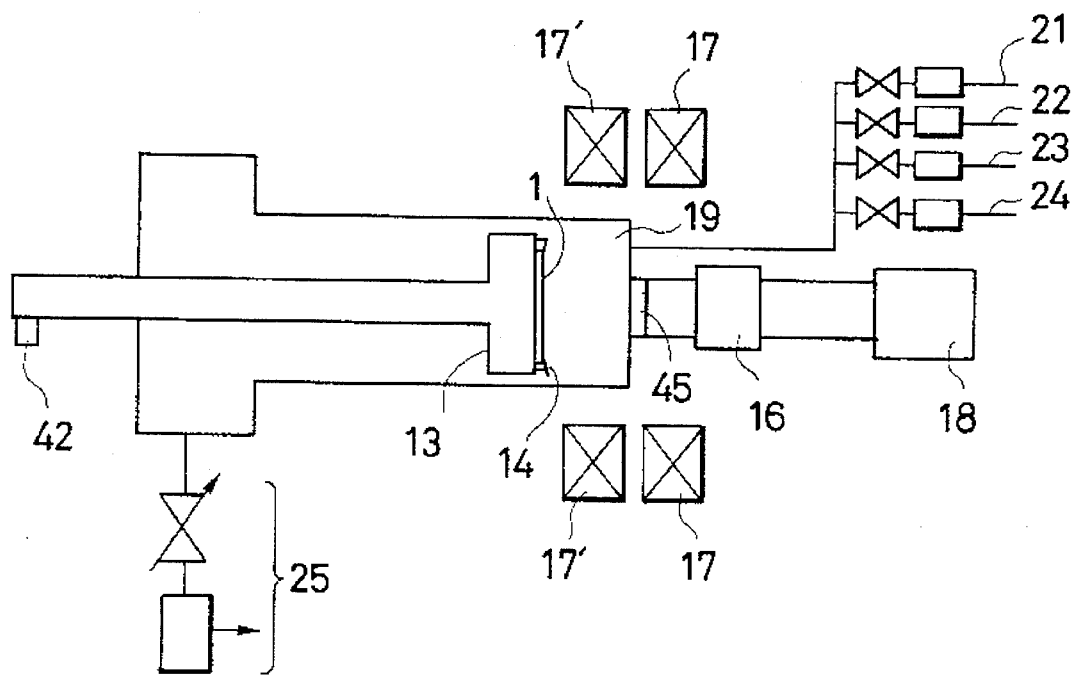
FIG. 1 is a cross sectional view showing a CVD apparatus for use in forming diamond light emitting devices in accordance with the present invention.

Referring now to FIG. 1, a microwave-assisted CVD apparatus provided with associated Helmholtz coils 17 and 17' for use in depositing diamond films is shown. The apparatus comprises a vacuum chamber defining a deposition space 19 therein, a microwave generator 18 connected to the chamber through an attenuater 16 and a quartz window 45, a gas introduction system having four inlet ports 21 to 24, a gas evacuation system 25 coupled with the chamber through a pressure controlling valve and a substrate holder 13 provided in the chamber and with a substrate position adjusting mechanism 42 for supporting a substrate 1 at an appropriate position. By the use of the adjusting mechanism 42, the axial position of the holder can be adjusted in order to change the volume of the reactive spece 19. The evacuation system funtions both as a pressure controller and as a stop valve. The pressure in the chamber is adjusted by means of the valve. The inside of the chamber and the holder 13 are circular and coaxial with each other. The procedure of depositing diamond films in the apparatus is as follow.

The substrate, for example, a single crystalline silicon semiconductor wafer of 2 to 6 inches, e.g. 4 inches diameter, is mounted on the holder 13. The surface of the substrate is preferably given scrachs in advance which form focuses for crystalline growth. The scrachs are formed for example by putting the substrate in a liquid in which diamond fine particles are dispersed and applying ultrasonic waves thereto for 1 minute to 1 hour. After fixing the substrate 1 on the holder 13 with a keeper 14, the pressure in the reaction space 19 is reduced to $10^{-3}$ to $10^{-8}$ Torr by means of the evacuation system followed by introduction of a reactive gas to a pressure of 0.01 to 3 Torr, typically 0.1 to 1 Torr, e.g. 0.26 Torr. The reactive gas comprises —OH bonds, .e.g an alcohol such as methyl alcohol ($CH_3OH$) or ethyl alcohol ($C_2H_5OH$) diluted with hydrogen at a volume ratio of alcohol/hydrogen=0.4 to 2. The hydrogen is introduced through the port 22 at 100 SCCM and the alcohol through the port 21 at 70 SCCM for example. The coils are energized during the deposition to induce a magnetic field having a maximun strength of 2K Gauss and a resonating strength of 875 Gauss at the surface of the substrate 1 to be coated. Then, microwaves are applied at 1 to 5 GHz, e.g. 2.45 GHz up to 10 KW in the direction parallel to the direction of the magnetic field to cause ionized particles of the reactive gas in the form of plasma to resonate therewith in the magnetic field. As a result, a polycrystalline film of diamond grows on the substrate. 2 hour deposition for example can form a diamond film of 0.5 to 5 micrometers thickness, e.g. 1.3 micrometers thickness. During the deposition of diamond film, carbon graphite is also deposited. However, the graphite, which is relatively chemically unstable as compared with diamond, reacts with radicals which also occur in the plasma of the alcohol and is removed from the deposited film. The temperature of the substrate 1 is elevated to 200° C. to 1000° C., typically 300° C. to 900° C., e.g. 800° C. by microwaves. If the substrate temperature is too elevated, water cooling is effected to the substrate holder 13. If the substrate temperature is too low, the substrate is heated from the holder side by means of a heating means (not shown).

In accordance with prefered embodiments of the present invention, some impurities may be introduced into diamond films during deposition. Examples of such impurities include S, Se and Te. In case of S, $H_2S$ or $(CH_3)_2S$ may be introduced as a dopant together with the reactive gas at a volume ratio of dopant gas/alcohol=0.001 to 0.03. In the same manner, $H_2Se$, $H_2Te$, $(CH_3)_2Se$ and $(CH_3)_2Te$ can be used as dopant gases. Also, elements of Group IIb such as Zn and Cd can be introduced using a dopant gas of hydrogen or organic compound thereof. For example, $Zn(CH_3)_2$ is used as a dopant gas and introduced together with $CH_3OH$ at a volume ratio of $Zn(CH_3)_2/CH_3OH$=0.005 to 0.03. If p-type diamond is desired, methyl boron may be input together with alcohol, e.g. at a volume ratio of $B(CH_3)_3/CH_3OH$=0.005 to 0.03.

Referring now to FIGS. 2(A) to 2(D), a method of forming a light emitting device in accordance with a first embodiment of the present invention will be explained. A diamond coating 2 is deposited on a p-type silicon semiconductor substrate 1 of a 4-inch wafer to a thickness of 0.5 to 3.0 micrometers, e.g. 1.3 micrometers, by the microwave-assisted plasma CVD method in a magnetic field as described above. The surface of the substrate 1 to be coated has been given scrachs. During the deposition, $Zn(CH_3)_2$ or $B(CH_3)_3$ is introduced, if desired, as a dopant gas together with $CH_3OH$ diluted by hydrogen at a volume ratio of $CH_3OH/H_2$=0.8. The volume ratio of the dopant gas/ $CH_3OH$ is 0.005 to 0.03.

An n-type semiconductor film 3 of silicon or a silicon carbide ($Si_xC_{1-x}$; $0<x<1$, pref. $0<x<0.5$) is deposited on the diamond film 2 to a thickness of 300 angstroms to 0.3 micro-meter in the same manner as the diamond film except that silane, in place of the alcohol, is used together with a dopant gas of $PH_4$. In the case of silicon carbide, a carbon compound gas such as $CH_4$ is further introduced. On the semiconductor film 2, a matallic film of molybdenum or tungstem is further deposited to a thickness of 0.1 to 0.5 micrometer. Such a refractory metal film is suitable in view of the following thermal annealing procedure. If the temperature throughout the manufacturing process is not elevated above 500° C., an aluminum film is deposited instead to a thickness of 0.5 to 2 micrometers.

Figure 2A:
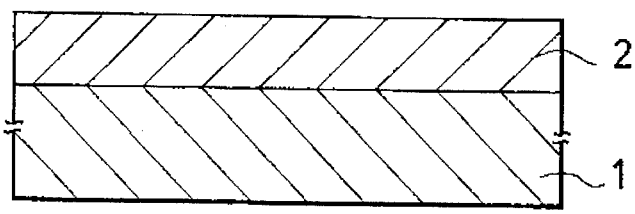
FIGS. 2(A) to 2(D) are cross sectional views showing a method of manufacturing diamond light emitting devices in accordance with a first embodiment of the present invention.
Figure 2B:
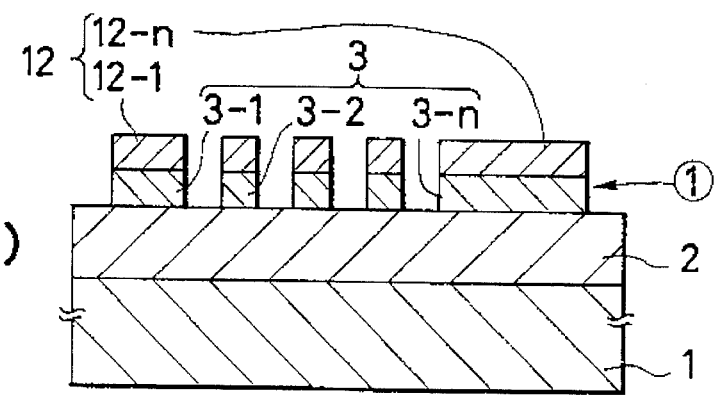
Figure 2C:
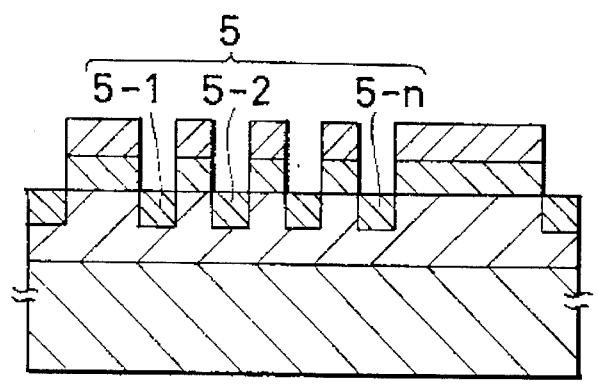
Figure 2D:
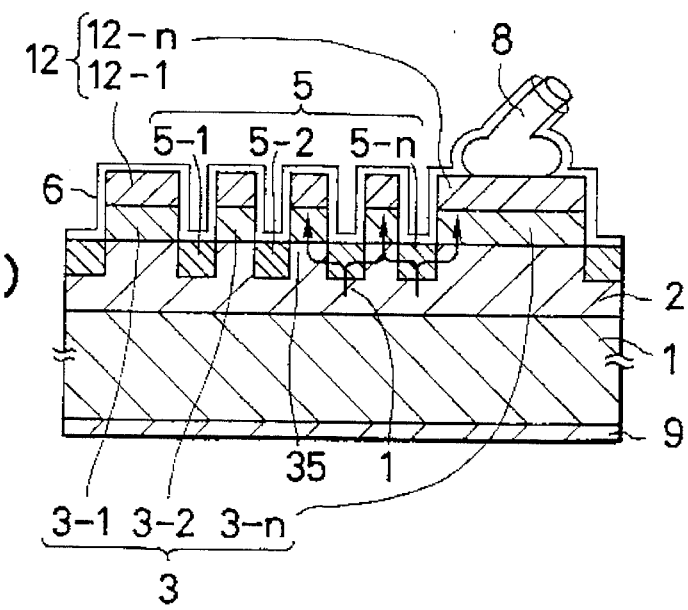
Figure 4:
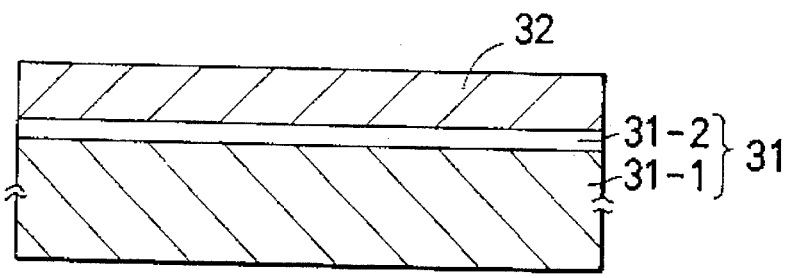
FIGS. 4(A) to 4(D) are cross sectional views showing a method of manufacturing diamond light emitting devices in accordance with a fourth embodiment of the present invention.
Figure 4:
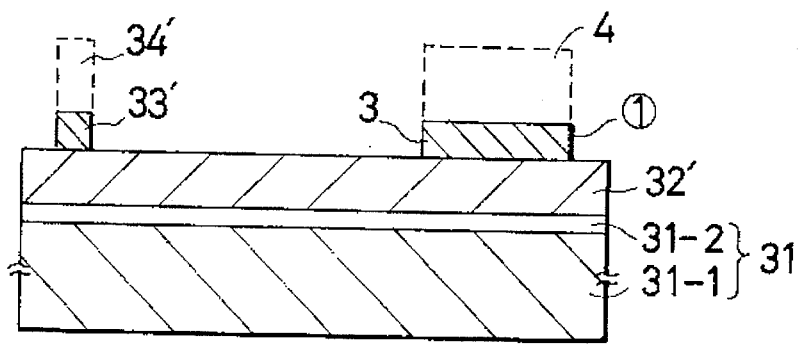
Figure 4:
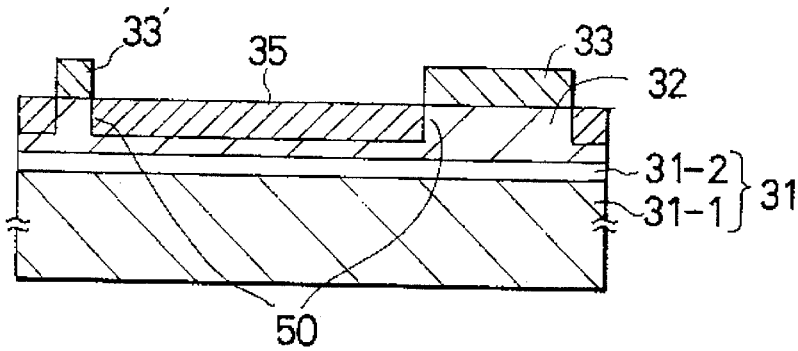
Figure 4:
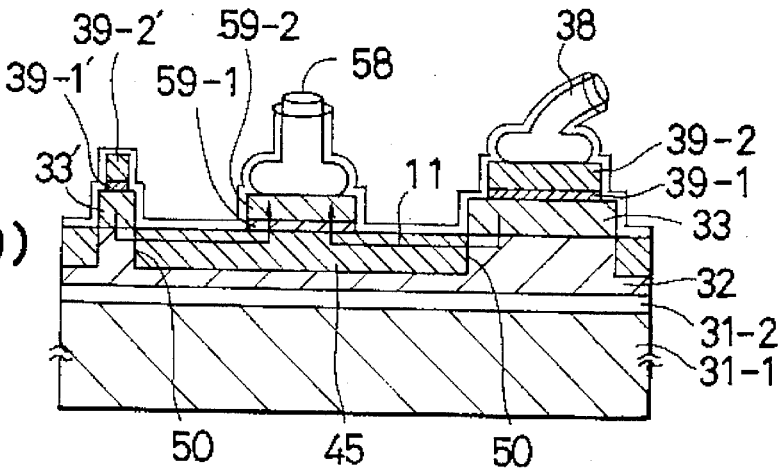

The metallic film 12 is coated with a suitable photoresist mask and patterned by dry etching to form electrodes 12-1, 12-2, . . . , 12-n in the form of strips or a comb. The underlying semiconductor film 3 is also patterned following the dry etching of the electrodes in a self-aligning manner to leave semiconductor regions 3-1, 3-2, . . . , 3-n corresponding to the electrodes 12-1, . . . 12-n. The exposed portions of the underlying diamond film 2 is then doped with S or Se with the electrodes as a mask by applying an acceleration voltage of 50 to 200 KeV to a density of $1\times10^{18}$ to $3\times10^{20}$ $cm^{-3}$, e.g. $2\times10^{19}$ $cm^{-3}$. The diamond film 2 is subjected to thermal annealing in an oxygen atmosphere or in air to introduce oxygen into the ion doped regions 5-1 to 5-n of the diamond film 2. As a result, a PIN junction is formed between the substrate 1 and the semiconductor film 3. A lead 8 is attached to the electrode by a known wire bonding technique. The upper surface of the structure is coated with a silicon nitride film 6 for the purpose of antireflection as shown in FIG. 2(D). The bottom surface of the substrate 1 is coated with a lower electrode 9. Finally, the structure is enclosed by a transparent plastic moulding in order to obtain mechanical strength and a wet-proof structure.

In this structure, current flows from the substrate 1 to the electrodes 12-1, . . . 12-n through the substrate 1, the diamond film 2, the ion doped regions 5-1 to 5-n and the silicon semiconductor film 3-1, 3-2, . . . , 3-n in this order. Light emission takes place mainly in the ion doped regions of the diamond film 2 and for this reason light rays can emit outward without no impediment of the silicon semiconductor film 6. When a voltage of 10 to 200 V (e.g. 50 V) was applied across the diamond film 2 of the diamond light emitting device between the upper electrode 12 and the lower electrode 9, the diamond emitted blue visual light (475 nm ±5 nm) at 14 $cd/m^2$ by virtue of current passing therethrough. The voltage may be applied as a DC voltage or as a pulse train at no higher than 100 Hz of a duty ratio of 50%. The light emission was not reduced even after continuing operation for a month.

A second embodiment will be described in below in conjucntion with FIGS. 3(A) to 3(D) which are very similar as FIGS. 2(A) to 2(D) and therefore the manufacturing process is largely similar as the first embodiment except for those particularly described in the followings. Corresponding explanations will be dispensed with.

A diamond film 2 of 0.5 to 3 micrometers average thickness is deposited on an n-type silicon semiconductor substrate 1. The diamond film is not doped with any impurity. A p-type silicon carbide semiconductor film 3 and an upper molibdenum or tungstem film 12 are deposited on the diamond film 2. These films 3 and 12 are covered with a mask 4 in the same manner as the first embodiment. The following photo-etching is effected only partially and not completely through the silicon carbide film 3. Bottom portion of the semiconductor film 3 contacting the diamond film 2 is left even after the etching as shown by 15-1 to 15-n.

Next, as illustrated in FIG. 1(C), zinc (Group IIb) is introduced into the diamond film 2 by ion implantation to $9.5\times10^{19}$ $cm^{-3}$ to form impurity regions 5-1, 5-2, . . . 5-n. This silicon carbide regions 32 effectively function as a protector of the ion implanted diamond film 2. The optical energy gap of the silicon carbide is desirably controlled to be no lower than 2.5 eV in order not to form impediment to radiation from the diamond film 2.

In this embodiment, the structure is formed with an N-diamond-P junction which is reverse to the P-diamond-N junction of the first embodiment. An element of Group IIb instead of Group VIb is used as impurity functioning as radiation centers. On the diamond film which is not doped, the impurity semiconductor film is located as a buffer film and a current path. The semiconductor film and the overlying electrode arrangement are patterned into a number of parallel strips with the light emitting doped diamond regions 5-1, . . . 5-n therebetween. When a 40 V was applied between the electrode 7 and the substrate 1, 11 $cd/cm^2$ light emission at 480 nm (blue) was observed. The illumination is darker as compared to that of the first embodiment. However, it is sufficient for commercialization.

A third embodiment will be described in below. This embodiment can be illustrated also in conjucntion with FIGS. 2(A) to 2(D) like the first embodiment and therefore the manufacturing process is largely similar as the first embodiment except for those particularly described in the followings. No redundant description will not repeated.

In this embodiment, a diamond film 2 is deposited using a boron dopant to be a p-type diamond film on a p-type silicon semiconductor substrate 1. An n-type silicon carbide film 3 is formed on the diamond film 2. Upper electrodes 12-1, . . . 12-n are formed on the film 3 in the same manner as the first embodiment. Then, Se (Group VIb) is introduced into the diamond film 2 by ion implantation at an acceleration voltage of 50 to 200 KeV to $1\times10^{19}$ to $3\times10^{20}$ $cm^{-3}$ to form impurity regions 5-1, 5-2, . . . 5-n followed by thermal annealing in air to also introduce oxygen into the impurity regions. Accordingly, two elements of Group VIb (oxygen and selenium) are added to the diamond film. This embodiment is excellent in long-term stability. The emission was 22 $cd/m^2$ at 510 nm, which was greenish blue.

Referring now to FIGS. 4(A) to 4(D), a method of forming a light emitting device in accordance with a fourth embodiment of the present invention will be explained. A substrate 31 having an insulated surface is prepared by coating a silicon semiconductor substrate 31-1 with a silicon nitride film 31-2 of 0.1 to 0.5 micrometer thickness. The surface of the substrate 31 to be coated is given scrachs. A diamond coating 32 is deposited on the substrate 31 to a thickness of 0.5 to 3 micrometers by the microwave-assisted plasma CVD method in a magnetic field as described above. $Zn(CH_3)_2$ or $B(CH_3)_3$ is introduced, if desired, during the deposition as dopant gas together with $CH_3OH$ diluted by hydrogen at a volume ratio of $CH_3OH/H_2=0.8$. The volume ratio of dopant gas/$CH_3OH$ is 0.005 to 0.03.

On the diamond film 32, a p-type semiconductor film 33 of silicon or a silicon carbide ($Si_xC_{1-x}$; $0<x<1$, preferably $0<x<0.5$) is deposited to a thickness of 300 angstroms to 0.3 micrometer in the same manner as the diamond film except that silane ($SiH_4$) is used together with a dopant gas of $B_2H_6$ in place of the alcohol. In the case of silicon carbide, a carbon compound gas such as $CH_4$ is further introduced. The semiconductor film 3 is coated with a suitable photoresist mask 34 and patterned to leave buffer films 33 and 33'. The exposed portions of the underlying diamond film 32 is then doped with S or Se with the mask over the buffer films 3 by an accelation voltage of 50 to 200 KeV to a density of $1\times10^{18}$ to $5\times10^{20}$ $cm^{-3}$, e.g. $6\times10^{19}$ $cm^{-3}$. By this procedure, the boundary of the doped region 35 (impurity diamond) of the diamond film 32 is coincident with the perimeter of the mask 34, i.e. the perimeter of the buffer films 3, and therefore dispersion of characteristics, such as the standard voltage to be applied thereto, of products can be minimized. The substrate 31 is then subjected to thermal treatment in an oxygen atmosphere or air to introduce oxygen into the ion doped regions 35-1 to 35-n. After the thermal treatment, silicon oxide occuring on the surface of the buffer films 33 and 33' is removed by putting the substrate 31 in a thin hydrofluoric acid. Then, a 0.05 to 0.5 micrometer thick molybdenum or tungstem film and a 0.5 to 2 micrometers thick aluminum film are deposited on the structure over the semiconductor film 33. These metallic films are selectively removed by photoetching through another photoresist mask in order to form electrodes 39-1, 39-2, 59-1 and 59-2. The molybdenum or tungstem electrode 39-1 and 39-2 functions also as a buffer film. The aluminum electrodes 39-2 and 59-2 are provided for making electrical contact with leads 38 and 58 which are attached by a known wire bonding technique. The upper surface of the structure is coated with an antireflection film of silicon nitride 6 and enclosed with a transparent plastic moulding in the same manner as the previous embodiments.

In this structure, current laterally flows from the electrodes 39-1 and 39-2 (or another electrically connected electrode 39-1' and 39-2') to the electrodes 59-1 and 59-2 through the undoped diamond 32 and the ion doped diamond film 35 in this order. Light emission takes place mainly in the ion doped regions of the diamond film 32 and for this reason light rays can emit outward without no impediment of the silicon semiconductor film 32 and the silicon carbide film 32. When a voltage of 10 to 200 V (e.g. 50 V) was applied between the leads 38 and 58, diamond emitted blue visual light (475 nm ±5 nm) at 17 cd/m² by virtue of current passing through the ion implanted diamond.

Figure 5:
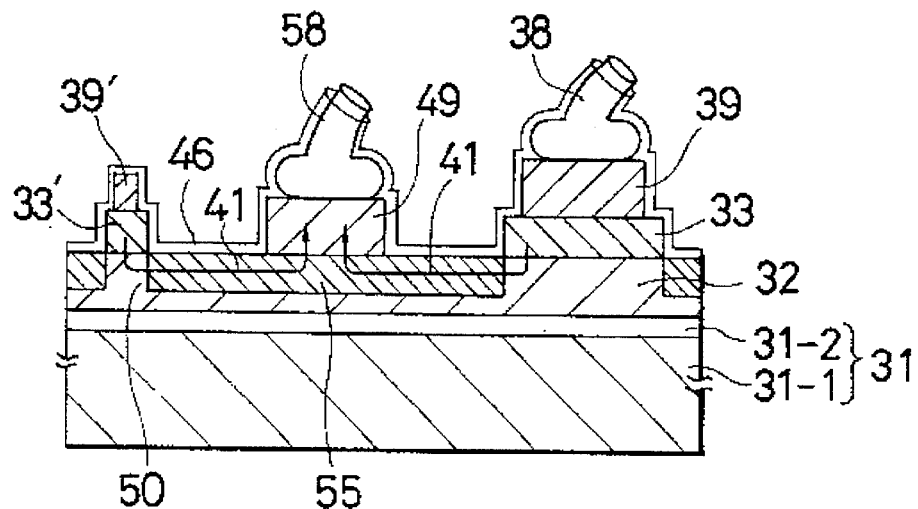
FIGS. 5 and 6 are cross sectional views showing diamond light emitting devices in accordance with fifth and sixth embodiments of the present invention.

A fifth embodiment will be described hereinbelow in conjucntion with FIG. 5. The manufacturing process is largely similar as the fourth embodiment except for those particularly described in the followings and therefore no redundant explanation will be repeated.

A diamond film 32 of 0.5 to 3 micrometers average thickness is deposited on an insulating substrate 31. The diamond film 32 is not doped with any impurity. A p-type silicon or silicon carbide semiconductor film is deposited on the diamond film 32. The semiconductor film is covered with a mask and patterned to form buffer films 33 and 33' in the same manner as the fourth embodiment.

Next, zinc (Group IIb) is introduced into the diamond film 32 by ion implantation to $9.5\times10^{19}$ $cm^{-3}$ to form impurity regions 55 with the mask and the buffer films 33 and 33'. An aluminum film of 1.5 micrometers thickness is deposited and patterned with another mask (not shown) to form electrodes 39, 39' and 49 followed by thermal annealing at 400° to 500° C. in air. The thermal annealing is carried out at temperatures no higher than 500° C. in an oxidizing atromsphere in general. In this embodiment, the electrode 49 is in direct contact with the diamond film, which is doped with an impurity. When a 40 V was applied between the electrodes 39, 39' and 49, 14 cd/cm² light emission at 480 nm was obserbed. The illumination is darker than that of the fourth embodiment. However, it is sufficient for commercialization.

Figure 6:
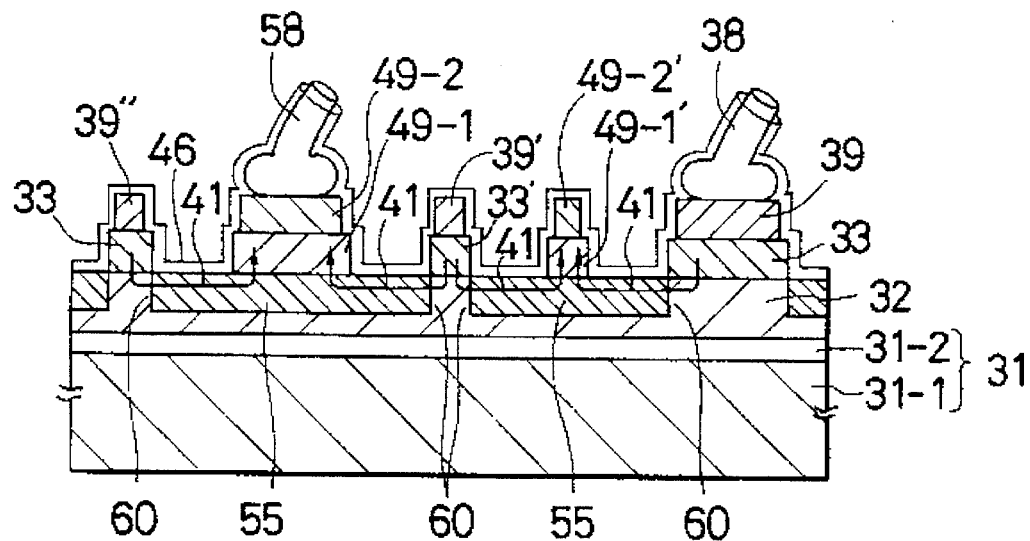

A sixth embodiment will be described in conjuction with FIG. 6. The manufacturing process is largely similar as the fourth embodiment except for those particularly described in the followings and therefore similar explanation will be omitted.

In this embodiment, a diamond film 32 is deposited on an insulated semiconductor wafer 31 using a dopant of oxygen. An n-type silicon carbide film is formed on the diamond film 2 and patterned to leave buffer films 33, 33' and 33" in the form of a number of teeth of a comb for constructing a large light emitting area. Then, Se (Group VIb) is introduced into the diamond film 2 by ion implantation at an acceleration voltage of 50 to 200 KeV to $1\times10^{19}$ to $6\times10^{20}$ $cm^{-3}$ to form impurity regions 5-1, 5-2, . . . 5-n followed by thermal annealing in air to further introduce oxygen into the impurity regions. Accordingly, two elements of Group VIb are added to the diamond film. Other buffer films 49-1 and 49-2 of a p-type semicojnductor are formed on the doped regions 55. Silicon oxide formed at the surface of the semiconductor film 33, 33', 33", 49-1 and 49-1' is removed by a thin hydrofluoric acid. Then, aluminum electrodes 39, 39',39", 49-2 and 49-2' are formed on the semiconductor films. After dicing the wafer into a number of such light emitting devices, each device is mounted on a lead frame or a stem structure followed by wire bonding of lead wiring 38 and 58. This embodiment is excellent in long-term stability. The emission was 29 cd/m² at 490 ±10 nm, which was greenish blue.

As described above, in accordance with the embodiments of the present invention, diamond devices can be manufactured only with one or two photomasks and a very high yeild is expected. For example, nearly 10000 light emitting elements of 0.8 mm×0.8 mm can be formed within the 4-inch wafer.

The foregoing description of preferred embodiments has been presented for purposes of illustration and description. It is not intended to be exhaustive or to limit the invention to the precise form described, and obviously many modifications and variations are possible in light of the above teaching. The embodiment was chosen in order to explain most clearly the principles of the invention and its practical application thereby to enable others in the art to utilize most effectively the invention in various embodiments and with various modifications as are suited to the particular use contemplated. For example, diamond electric device in accordance with the present invention can be manufactured in a multichamber apparatus comprising a first chamber for deposition of p-type semiconductors, a second chamber for deposition of diamond and a third chamber of deposition of n-type semiconductors. These chambers are coupled in series in order to streamline the deposition. The patterns of the electrodes and the semiconductor film are also not limited to those described above, coaxial circles or other configurations can be employed in order to comply with the requirement of the application thereof.

The present invention is broadly applicable to any electric device comprising a diamond film. These electric devices can be formed on a single substrate, i.e. an integrated circuit device which may consists of diamond light emitting devices, diamond diodes, diamond transistors, diamond resistances, diamond capacitors and the like. Of course, it is possible to severe a single substrate, after a number of diamond devices are formed on the substrate, into indivisual separate devices.

What is claimed is:

1. A method of manufacturing diamond devices comprising the steps of:

depositing a diamond film on a semiconductor substrate;

depositing a semiconductor film on said diamond film;

depositing a metal film on said semiconductor film;

patterning said metal film with a mask to produce an electrode arrangement of said metal film; and introducing an impurity to said diamond film with said electrode arrangement as a mask.

2. The method of claim 1 wherein said semiconductor film is patterned with the mask with which said metal film is patterned.

3. The method of claim 1 wherein said metal film is patterned into a number of teeth of a comb.

4. A method of manufacturing diamond devices comprising the steps of:

depositing a diamond film on an insulator or semiconductor substrate;

depositing a semiconductor film on said diamond film;

patterning said semiconductor film;

introducing an impurity to said diamond film with said patterned semiconductor film as a mask; and forming at least one electrode on said semiconductor film.

5. A method of claim 4 wherein said impurity is selected from the group consisting of Zn, Cd, Hg, O, S, Se, Te and Po.

6. A method of manufacturing diamond devices comprising the steps of:

depositing a diamond on an insulating or semiconductor substrate;

depositing a semiconductor buffer film on said diamond film;

patterning said buffer film;

introducing an impurity to said diamond film with said buffer film as a mask; and forming a pair of electrodes on said buffer film and/or said diamond film.

7. The method of claims 1, 4 or 6 wherein said semiconductor film comprises a silicon containing semiconductor material.

* * * * *